US008115366B2

(12) United States Patent
Hoffman et al.

(10) Patent No.: US 8,115,366 B2
(45) Date of Patent: Feb. 14, 2012

(54) SYSTEM AND METHOD OF DRIVING ULTRASONIC TRANSDUCERS

(75) Inventors: David Hoffman, Santa Cruz, CA (US); David Brubaker, San Carlos, CA (US); Alexandr Ikriannikov, Castro Valley, CA (US)

(73) Assignee: Versatile Power, Inc., Campbell, CA (US)

( * ) Notice: Subject to any disclaimer, the term of this patent is extended or adjusted under 35 U.S.C. 154(b) by 109 days.

(21) Appl. No.: 12/605,311

(22) Filed: Oct. 23, 2009

(65) Prior Publication Data

US 2010/0102672 A1 Apr. 29, 2010

Related U.S. Application Data

(60) Provisional application No. 61/107,982, filed on Oct. 23, 2008, provisional application No. 61/182,325, filed on May 29, 2009.

(51) Int. Cl.
*H01L 41/08* (2006.01)

(52) U.S. Cl. .................................................. 310/316.01

(58) Field of Classification Search ............. 310/316.01, 310/317, 319
See application file for complete search history.

(56) References Cited

U.S. PATENT DOCUMENTS

| | | | | | |
|---|---|---|---|---|---|
| 4,965,532 | A | * | 10/1990 | Sakurai | 331/4 |
| 4,973,876 | A | * | 11/1990 | Roberts | 310/316.01 |
| 5,357,423 | A | * | 10/1994 | Weaver et al. | 700/28 |
| 5,425,704 | A | * | 6/1995 | Sakurai et al. | 604/22 |
| 5,563,478 | A | | 10/1996 | Suganuma | |
| 6,819,027 | B2 | * | 11/2004 | Saraf | 310/316.01 |
| 2003/0107298 | A1 | | 6/2003 | Matsushita et al. | |

FOREIGN PATENT DOCUMENTS

| | | |
|---|---|---|
| JP | 2005-003687 | 1/1993 |
| JP | 2008-236834 | 10/2008 |

OTHER PUBLICATIONS

International Search Report for PCT/US2009/061971, mailed May 27, 2010, 7 pgs.

* cited by examiner

*Primary Examiner* — Mark Budd
(74) *Attorney, Agent, or Firm* — Squire, Sanders & Dempsey (US) LLP

(57) ABSTRACT

A transducer is optimally driven at or near its resonant frequency by a driver system that adapts to variations and/or changes to the resonant frequency of the transducer due to variations in piezo materials, manufacturing, assembly, component tolerances, and/or operational conditions. The system may include an output controller, a phase track controller, a frequency generator, a drive, circuitry to determine a phase angle between the transducer voltage and transducer current, and circuitry to obtain transducer admittance from the transducer voltage and transducer current.

20 Claims, 17 Drawing Sheets

SYSTEM AND METHOD OF DRIVING ULTRASONIC TRANSDUCERS

This application claims the benefit of U.S. Provisional Application No. 61/107,982, filed Oct. 23, 2008, and U.S. Provisional Application No. 61/182,325, filed May 29, 2009, the entire contents of which are incorporated herein by reference.

FIELD OF THE INVENTION

This invention relates generally to ultrasonic transducers, and more particularly, to a system and method for driving ultrasonic transducers.

BACKGROUND OF THE INVENTION

Ultrasonic transducers have been in use for many years. During that time little change has occurred in the way they are driven. Current driving circuits are based on resonant technology that has many limitations.

Current technology depends on resonant circuits to drive ultrasonic transducers. Resonant circuits are, by definition, be designed to operate in a very narrow range of frequencies. Because of this the transducer tolerances are held very tightly to be able to operate with the driving circuitry. In addition, there is no possibility of using the same driving circuit for transducers with different frequencies, and the circuit must be changed for every transducer frequency.

To drive ultrasonic transducers, a method is often required to generate a wide range of frequencies with high accuracy and very high frequency shifting speed. Tank circuits have been used to address this need. Tank circuits, which comprise a particular transducer coupled to circuitry uniquely configured to work with the transducer, allow the transducer to be driven at the resonance frequency specific to the particular transducer. A draw back with prior art systems and methods is that the circuitry of the tank circuit often cannot be used with another transducer having a different resonance frequency.

There is also a need for a system and method for driving any transducer regardless of the resonance frequency of the transducer. Such a system and method may drive multiple transducers each having a different frequency, thereby allowing device manufacturers to take advantage of economies of scale by implementing the same driver with various transducers having different frequencies.

SUMMARY OF THE INVENTION

Briefly and in general terms, the present invention is directed to a system and method for driving ultrasonic transducers.

In aspects of the invention, a system comprises a controller adapted to provide a voltage and a frequency, the controller configured to vary the voltage based on a current error signal derived from a drive current through a transducer and from a current command, the controller configured to vary the frequency based on at least one parameter indicative of whether the transducer is at or near a resonance state. The system also comprises a drive adapted to receive the voltage and the frequency from the controller, and adapted to provide a drive voltage at a drive frequency to the transducer based on the voltage and the frequency received from the controller, the drive voltage being at a level that maintains the drive current at substantially the current command, the drive frequency being at substantially a resonant frequency of the transducer.

In further aspects, the at least one parameter includes a phase angle between the drive current and the drive voltage.

In aspects of the present invention, a method comprises providing a drive voltage at a drive frequency to a transducer, the drive voltage causing a drive current through the transducer. The method further comprises sensing the drive current and determining a current error from the sensed drive current and from a current command. The method further comprises adjusting the drive voltage based on the current error, and determining at least one parameter from the sensed drive current and from the voltage level, the at least one parameter indicative of whether the transducer is at or near a resonance state, the at least one parameter including a phase angle between the drive current and the drive voltage. The method further comprises adjusting the drive frequency based on the at least one parameter, including maintaining the drive frequency at or substantially at a resonant frequency of the transducer.

The features and advantages of the invention will be more readily understood from the following detailed description which should be read in conjunction with the accompanying drawings

DETAILED DESCRIPTION OF PREFERRED EMBODIMENTS

Figure 1:
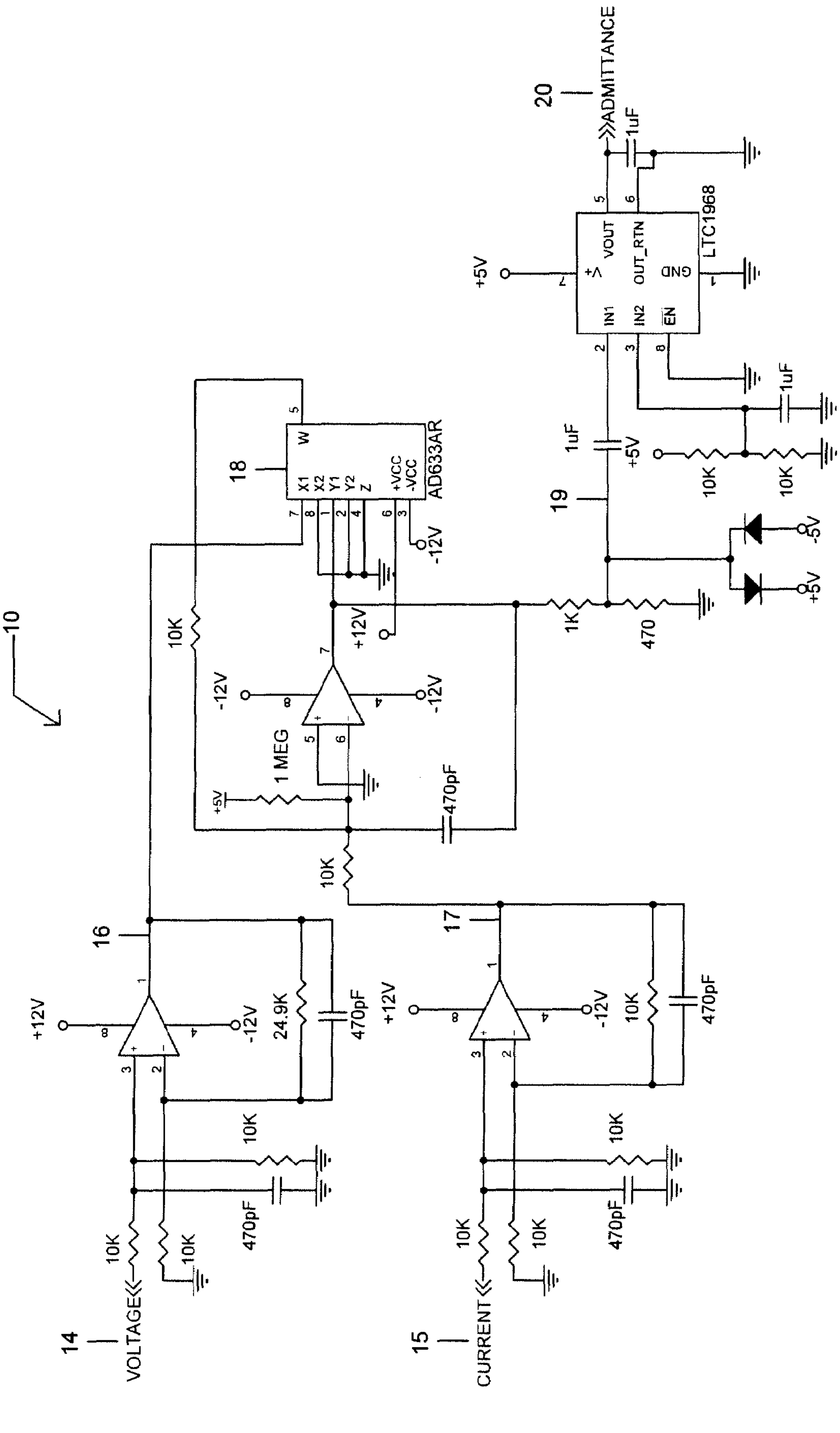
FIG. 1 is a schematic diagram showing a circuit configured to determine admittance in accordance with some embodiments of the present invention.

Some embodiments of the present invention involves hardware and software. The hardware may include a switching amplifier to create a sine wave output to an ultrasonic transducer. The ultrasonic transducer can be a piezoelectric transducer. The switching amplifier can be run with high efficiency over a broad range of frequencies and can, therefore, be used to drive transducers of many frequencies. The switching amplifier can also drive transducers that do not have tightly held frequency tolerances thereby reducing transducer production cost. This allows for reduction of production cost due to economies of scale and allows for customers that use different frequency transducers to always be able to use the same driver.

Previous ultrasonic generators have relied on resonant power sources or analog amplifiers to drive the transducer. In some embodiments of the present invention a class D or class E amplifier is used to amplify the output of a digitally controlled AC source. This technique frees the manufacturer and user from the requirement of designing a resonant system around a specific transducer. Instead, this system is usable for any transducer over a broad range of frequencies.

Previous class D and class E amplifiers have used traditional LC or cascaded LC filters to significantly reduce the effects of the class D or E carrier frequency on the signal frequency. In some embodiments of the present invention a two phase output signal is used in conjunction with a coupled transformer to reduce the effect of the carrier frequency to several times lower than could be done with similar size and cost components with the traditional LC type filters.

In some embodiments of the present invention, software could run entirely on low cost, 16-bit, integer-only microcontrollers. The more powerful DSP (digital signal processor) modules typically required in prior art are not required in the present invention, although DSP modules could be used in some embodiments.

A method is required to generate a wide range of frequencies with high accuracy and very high frequency shifting speed. A digital synthesizer could be used in an ultrasonic system to allow rapid and flexible frequency control for output of a frequency generator.

In some embodiments, dead time is minimized in switching circuits in order to minimize the output impedance to the transducer. The phrase "dead time" is the time in power switching circuits when all switching elements are off to prevent cross conduction. When determining the resonant frequency a minimum or maximum admittance is used. The admittance measured will vary much less between in resonance and out of resonance in a low Q system than in a high Q system. The dimensionless parameter "Q" refers to what is commonly referred to in engineering as the "Q factor" or "quality factor." Because Q is directly affected by the impedance of the driving circuit, this impedance must be kept very low. In addition to the commonly considered impedances of the output transformer, driving semiconductors, PCB (printed circuit board) and other directly measureable impedances, Applicants have found that the dead time has a very strong effect on the output impedance of the driver. As such, the switching circuit is configured to have a very small (approximately 50 nanoseconds) dead time. In some embodiments, the switching circuit has a dead time that is greater than or less than 50 nanoseconds.

For optimum operation, it is critical that the transducer be run at or near its resonant frequency point. The resonant frequency point of the transducer is defined as the frequency at which maximum real power is transferred from the drive amplifier to the transducer. Much work has been done to determine the best method for measuring when a transducer is at or near resonance.

Applicants have found that the admittance of the transducer gives a reliable indication of the proximity of the transducer to its resonant frequency point. Admittance is defined as the RMS (root-mean-square) amplitude of the transducer drive current divided by the RSM amplitude of the transducer drive voltage. The circuit 10 shown in FIG. 1 determines the RMS (root mean square) value of the admittance 12 of a driven transducer in real time. The RMS value of the admittance is used for analysis by software contained and run by the hardware. The RMS value of the admittance 12 is obtained from the RMS voltage 14 across the transducer and RMS current 16 supplied to the transducer.

The circuit in FIG. 1 is an example of a circuit that measures the real-time admittance of the load. RMS voltage 14 and RMS Current 15 are filtered. The filtered signals for voltage 16 and current 17 are fed into an analog divider 18 and the resultant output 19 is fed to an RMS converter. The final output 20 is RMS admittance. This is a known means to measure admittance.

Applicants have found that the phase of the transducer also gives a reliable indication of the proximity of the transducer to its resonant frequency point. Phase is defined as the phase angle between the transducer drive voltage and transducer drive current.

Figure 2:
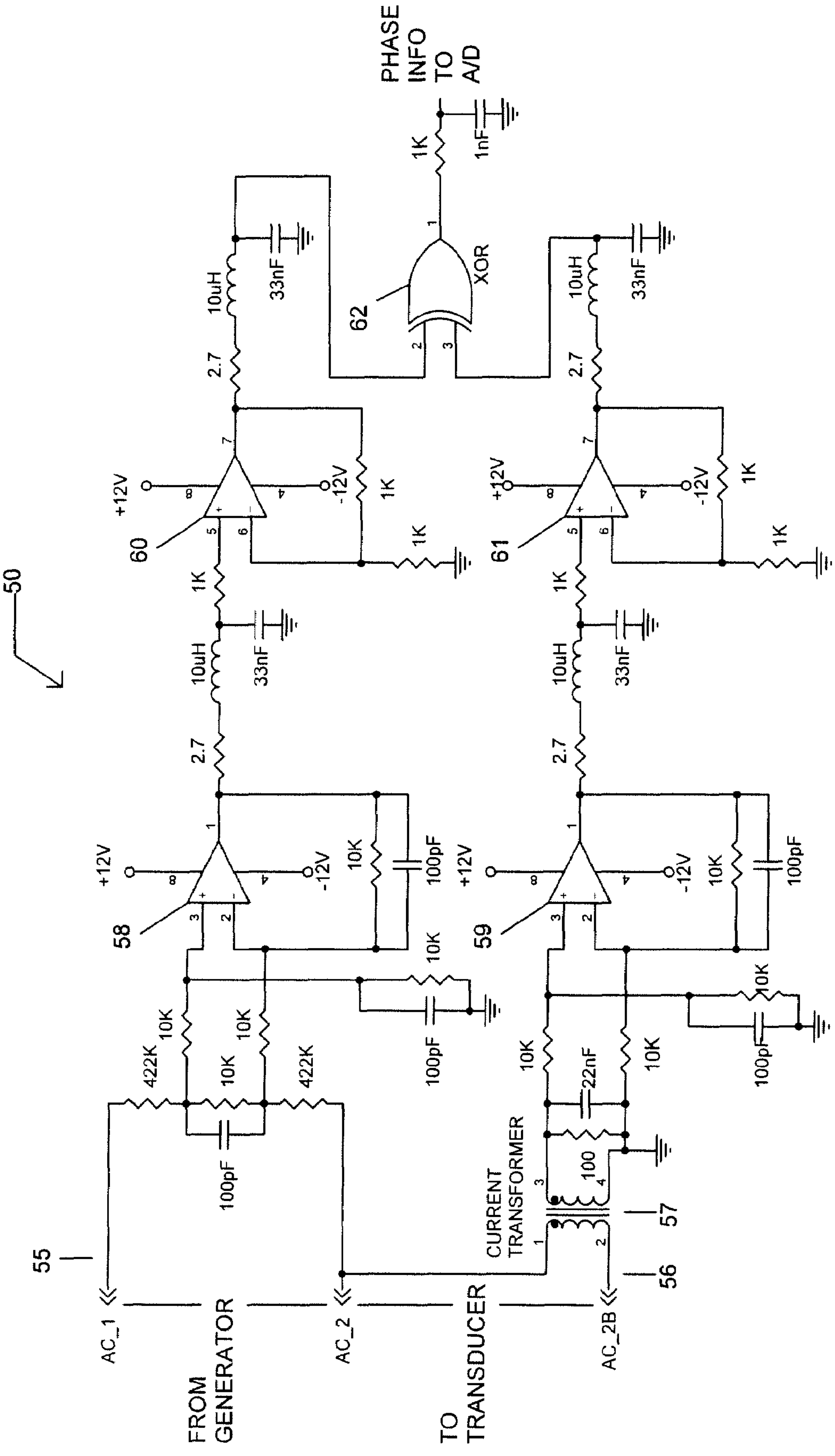
FIG. 2 is a schematic diagram showing a circuit having an exclusive OR gate, the circuit configured to determine a phase angle in accordance with some embodiments of the present invention.
Figure 2A:
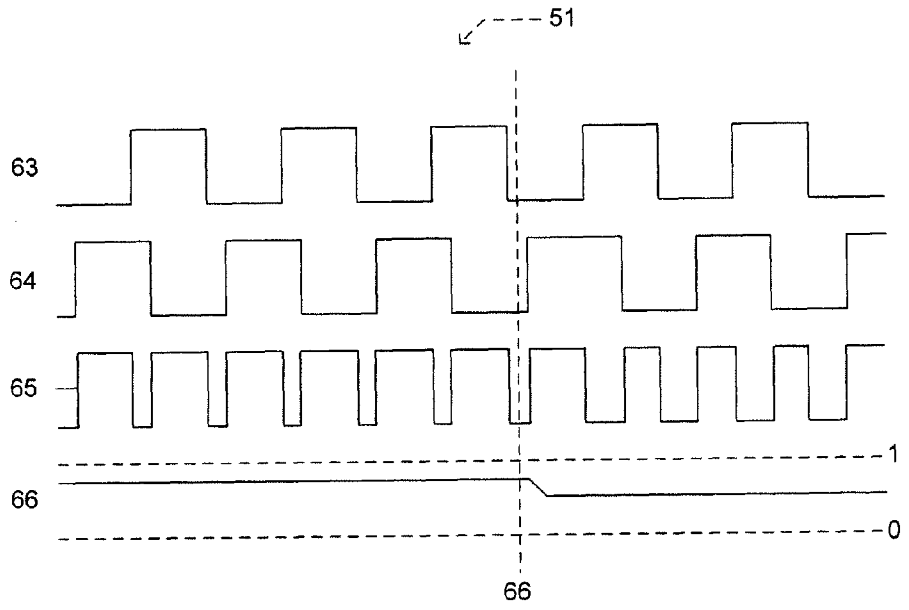
FIG. 2*a* is a flow diagram showing waveforms into and out of an exclusive OR gate of the circuit of FIG. 2.

The circuit shown in FIG. 2 is an example of a circuit that derives the phase relationship of two input signals. The voltage driving signal from the generator 55 is buffered and filtered by amplifier 57. The current of the generator signal is found by passing the generator output through current transformer 57 and then buffering and filtering this signal through amplifier 59. Each output (current and voltage) is put into a comparator. The output of the comparator will be high when the respective signal is above zero volts and will be low when it is below zero volts. The output of the comparators, therefore, transition when the input signal crosses zero. If the point where each signal crosses zero is compared an indication of the phase relationship will be known. To find this phase relationship and convert it into an analog voltage, an exclusive OR gate 62 is used and is output is passed through a simple RC filter. The waveforms into and out of the exclusive OR gate are shown in FIG. 2*a*. In this example signal 63 represents the output of the comparator for the voltage and signal 64 represents the output of the comparator for the current signal. The reader can observe that the two signals are out of phase and that the phase relationship changes at time 66. Persons skilled in the art will recognize that the output of an exclusive OR gate will be high when the input signals are different and low when they are the same. Signal 65, therefore, shows the output of the exclusive OR gate. The RC filter effectively integrates the waveform 65 resulting in signal 67. As can be seen, the result is an analog voltage 67 that is proportional to the phase relationship of the two input waveforms, 63, 64. This analog signal 67 is then input to the processor.

Figure 3:
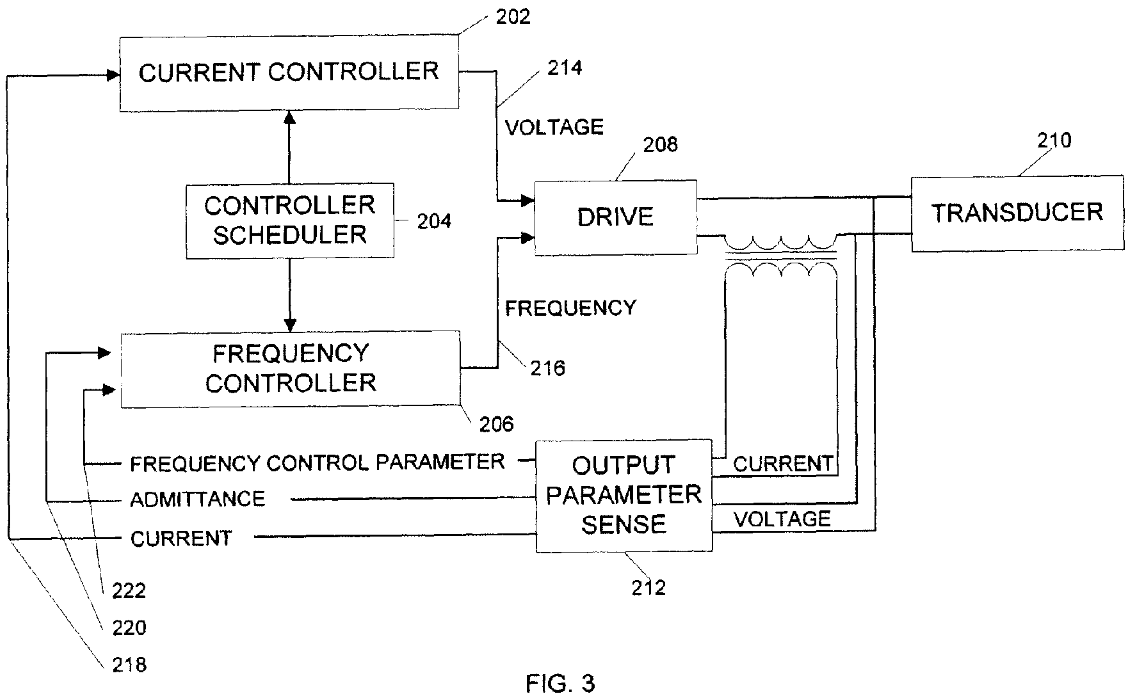
FIG. 3 is a block diagram showing a system for driving a transducer in accordance with some embodiments of the present invention.

FIG. 3 depicts a system and method of driving an ultrasonic transducer. The method may be implemented by hardware and software combined to provide adaptive feedback control to maintain optimum conversion of electrical energy provided to the transducer to motion of transducer elements.

In FIG. 3, the system 200 includes two controllers: a current controller 202 that maintains a constant commanded transducer current; and a frequency controller 206 that searches for and tracks the operating frequency. A controller scheduler 204 interleaves the operation of the two controllers 202, 206 to reduce the operation of one controller adversely affecting the operation of the other controller.

The drive 208 provides a drive signal of controlled voltage and controlled frequency to the transducer 210. An output parameter sense circuit 212 senses transducer drive voltage and transducer drive current and generates a measure of current 218, admittance 220, and a frequency control parameter 222. The frequency control parameter is different in different embodiments.

Current 218 is applied as an input to the current controller 202 which generates a voltage 214 applied to the drive 208. The current controller 202 sets the voltage 214 to maintain the current required for correct operation of the transducer 210 in its given application.

The frequency controller 206 performs two functions: frequency scanning and frequency tracking. The frequency scanning function searches for a frequency that is at or near the resonant frequency of the transducer. The frequency tracking function maintains the operating frequency at or near the resonant frequency of the transducer.

When the frequency controller 206 is frequency scanning, admittance 220 is applied to it as an input. The frequency controller sweeps the drive frequency over a range of frequencies appropriate for the transducer and application, searching for the resonant frequency.

When the frequency controller 206 is frequency tracking, a frequency control parameter 222 is applied to it as an input. The frequency controller sets the frequency required for correct operation of the transducer in its given applications.

When the frequency controller 206 performs either frequency scanning or frequency tracking, it applies the calculated frequency 216 to the drive 208.

The drive 208 may include the switching amplifier and switching circuits described above. The frequency controller 206 may include the digital synthesizer described above.

Frequency Controller

As previously mentioned, the frequency controller 206 performs two functions: frequency scanning and frequency tracking.

In many applications, initial application of drive to the transducer at its resonant frequency is critical. When, due to variations in transducer characteristics, applied power levels, and the mechanical load the transducer connects to, the resonant frequency is not a priori known, the frequency controller may perform a frequency scan to establish the drive frequency at or near the resonant frequency.

Figure 4:
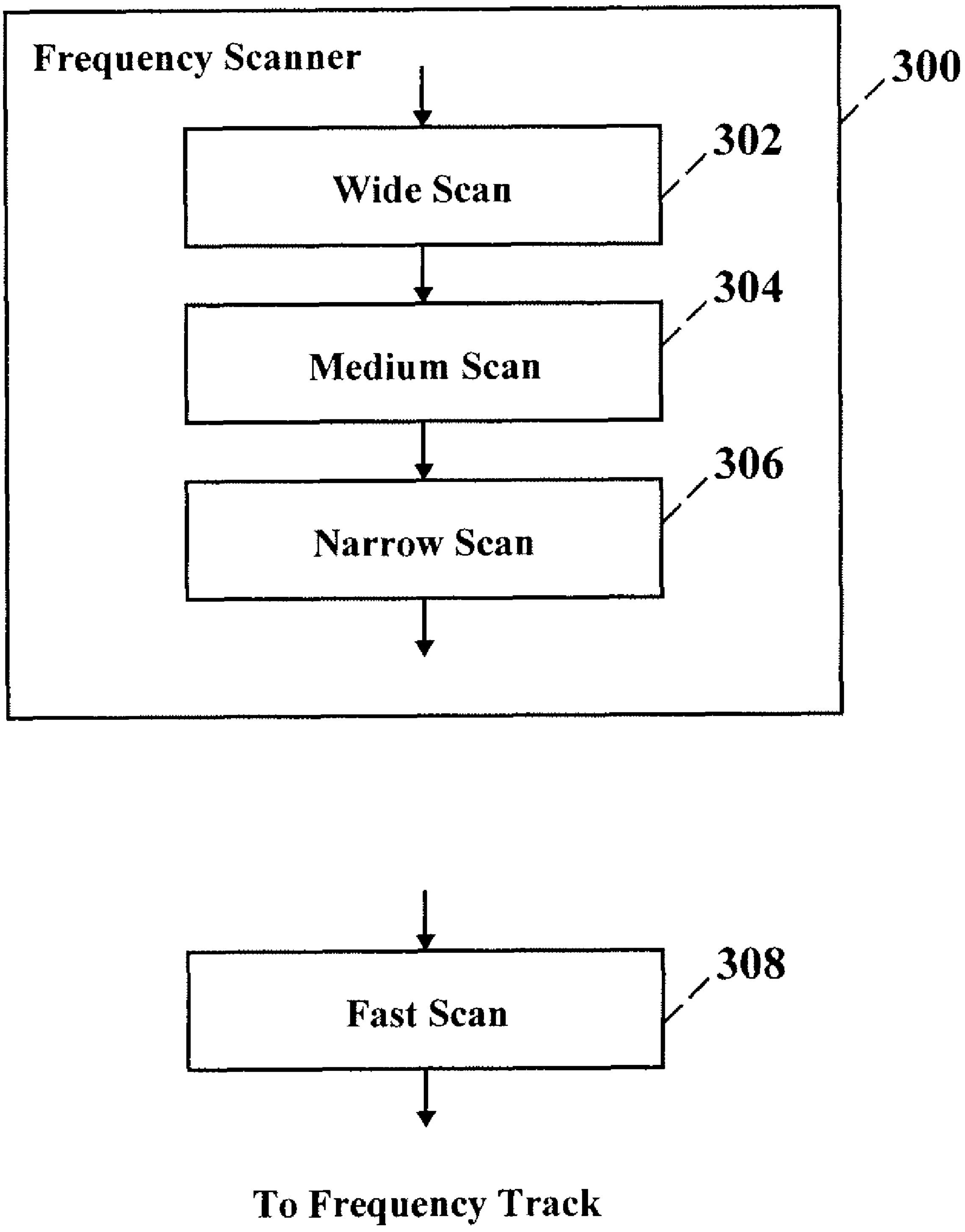
FIG. 4 is a flow diagram showing elements of a frequency controller in accordance with some embodiments of the present invention.

When performing a frequency scan, the frequency controller searches a predefined range of frequencies for the frequency at which the transducer admittance is maximum. As shown in FIG. 4, the frequency scanner 300 is made up of three sweep scans: a wide scan 302, which is followed immediately by a medium scan 304, which is followed immediately by a narrow scan 306. The wide scan includes a ±1 kHz sweep about a predefined frequency, in 4 Hz steps, with a 10 msec settling time after each step, and detecting the admittance after each settling time. The medium scan includes a ±100 Hz sweep about the frequency of maximum admittance detected by the wide scan, in 2 Hz steps, with a 25 msec settling time after each step, and detecting the admittance after each settling time. The narrow scan includes a ±10 Hz sweep about the frequency of maximum admittance detected by the medium scan, in 1 Hz steps, with a 50 msec settling time after each step.

In some embodiments, admittance is detected after each narrow scan settling time and, at completion of the narrow scan, the drive frequency is set to the frequency of maximum detected admittance.

In some embodiments, phase is detected after each narrow scan settling time and, at completion of the narrow scan, the drive frequency is set to the frequency with detected phase closest to the phase required for correct operation of the transducer in its given application.

An ultrasonic transducer will often have multiple frequencies at which the commanded phase is measured. The frequency of maximum admittance will always be at or close to the resonant frequency, the frequency of maximum real power transfer. For this reason, maximum admittance is used for wide and medium scans for the operating point, regardless of the method used in the narrow scan.

The frequency scanner 300 can be executed at either full power (as defined by the user) or at a predefined low power of less than 5 watts, measured at transducer resonance.

The frequency controller 206 may optionally perform a fast scan 308 as part of its operation, immediately prior to initiation of a frequency track algorithm. The fast scan includes a ±10 Hz sweep about the current frequency, in 2 Hz steps, with a 10 msec settling time after each step.

In some embodiments, admittance is detected after each fast scan settling time and, at completion of the fast scan, the drive frequency is set to the frequency of maximum detected admittance.

In some embodiments, phase is detected after each fast scan settling time and, at completion of the fast scan, the drive frequency is set to the frequency with detected phase closest to the phase required for correct operation of the transducer in its given application. The fast scan 308 can be executed at either full power or at less than 5 watts power.

The transducer resonant frequency may fluctuate during normal operation. This fluctuation may occur due to changes in operating conditions of the transducer, such as changes in temperature of the transducer and mechanical load on the transducer. Frequency tracking can be performed to compensate for this fluctuation in resonant frequency.

Figure 5:
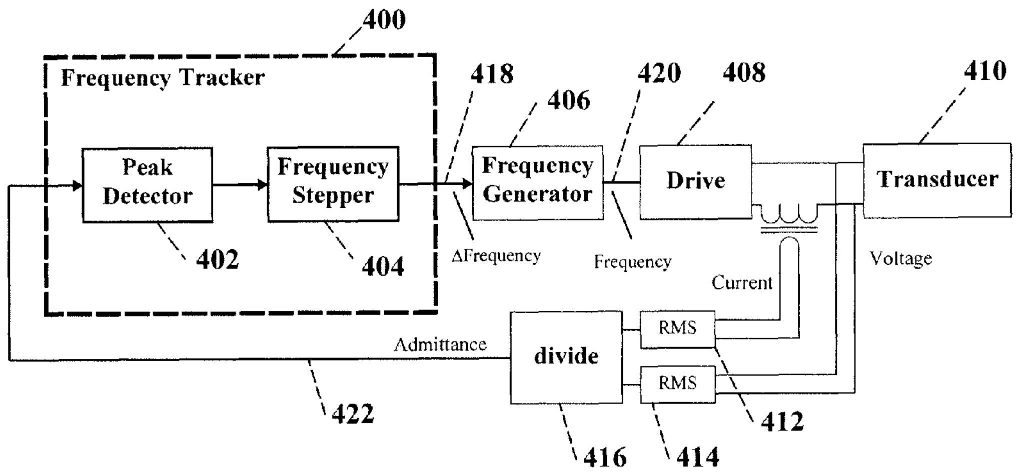
FIG. 5 is a block diagram showing a frequency tracker utilizing admittance in accordance with some embodiments of the present invention.

FIG. 5 shows an embodiment of a frequency tracker. The frequency tracker 400 is comprises two components: a peak detector 402 and a frequency stepper 404. The peak detector samples the transducer admittance 422. The peak detector then commands the frequency stepper 404 to take a random-size step, between 1 and 10 Hz in a random direction, either up or down. The frequency stepper calculates the random step size and direction and sends the frequency step, Δ frequency 418, to the frequency generator 406 which generates the new drive frequency 420 and applies it to the drive 408 (208 in FIG. 3). The frequency tracker delays a short time period based on the size of the frequency step (nominally 10 to 50 msecs) to allow the transducer to settle on the newly commanded frequency. Transducer 410 drive current and transducer drive voltage are continually monitored and converted to their RMS equivalent values by RMS converters 412 and 414, respectively. The divider 416 divides RMS current by RMS voltage to calculate admittance 422 which is applied to the peak detector 402. With this admittance, the peak detector calculates the change in detected admittance that resulted from the step in frequency.

If the detected admittance has increased by greater than a predefined amount, the next step 418 is taken in the same direction as the previous step, with step size based on the magnitude of the increase in admittance. For example, the magnitude of the step can be proportional to the detected increase in admittance. If the detected admittance has decreased by greater than a predefined amount, the next step 418 is taken in the opposite direction, with the magnitude of the step being based on the magnitude of the increase in admittance. If the detected admittance has neither increased by greater than a predefined amount nor decreased by greater than a predefined amount, the admittance is assumed to be at its peak and a zero magnitude "step" is taken. The frequency tracker delays a short time period to allow the transducer to settle and the peak detection and step sequence is repeated.

The maximum admittance of a transducer may increase, remain unchanged, or decrease, depending on changes in operating conditions of the transducer. Frequency tracking for increasing and unchanging maximum admittance values is performed by the above-described frequency tracking method. Tracking the resonant frequency associated with a decreasing admittance maximum is performed by stepping quickly in equal magnitude steps in both directions about the current frequency until the decrease in admittance stops and increased admittance values are again detected. The Frequency Controller then changes the frequency to again lock on the point of maximum admittance.

The frequency tracking method described above can be implemented with an algorithm within software being run by the hardware of the system 200.

Figure 6:
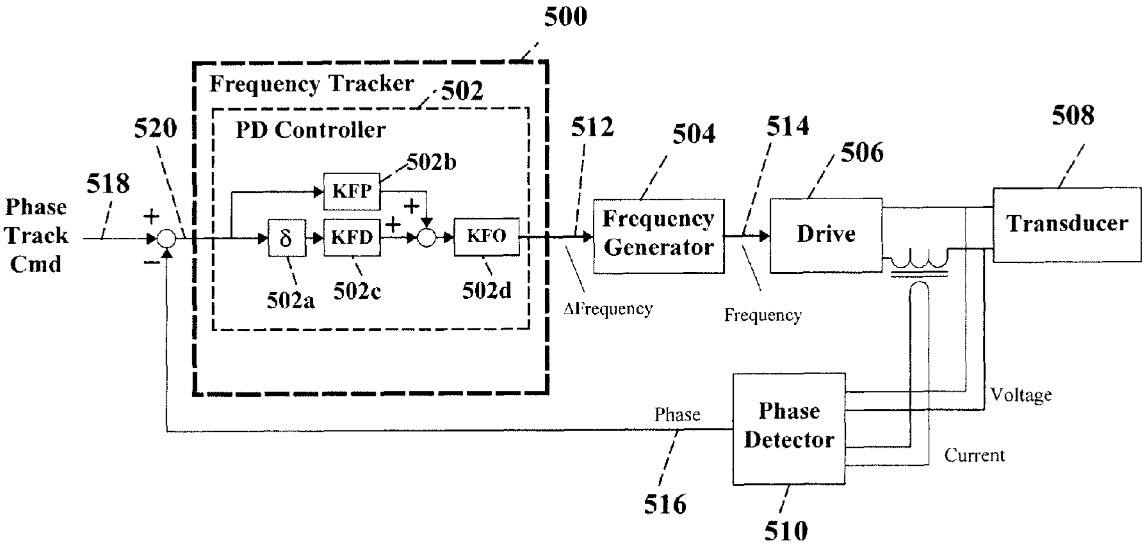
FIG. 6 is a block diagram showing a frequency tracker applying phase error to a PD controller in accordance with some embodiments of the present invention.

Another embodiment of the frequency tracker, shown in FIG. 6, uses the phase angle 516 between the transducer drive voltage and the transducer drive current to maintain the resonant frequency. For some ultrasonic transducer, the resonant frequency occurs at zero phase. For some transducers, and related to the transducer operating conditions, the resonant frequency occurs with a negative phase value. Commanded phase 518 is empirically selected for a given transducer with given set of operating conditions.

The frequency tracker 500 performs frequency tracking by applying a phase angle error term 520 to a Proportional-Derivative (PD) controller 502 at regular sampling intervals of between 5 and 20 msecs. The phase angle error term is calculated to be the difference between the phase track command 518 and the measured transducer phase 516. The PD controller 502 includes a differentiator, δ 502*a*, a proportional gain, KFP 502*b*, a differential gain, KFD 502*c*, and an output gain, KFO 502*d*. The output from the PD controller 502 in response to a phase error 520 is a step in frequency, Afrequency 512, of magnitude and sign necessary to drive the phase error 520 toward zero. The step in frequency 512 is applied to the frequency generator 504 which calculates the new frequency 514. The driver drives the transducer 508 at the frequency 514 from the frequency generator 504.

Current Controller

Figure 7:
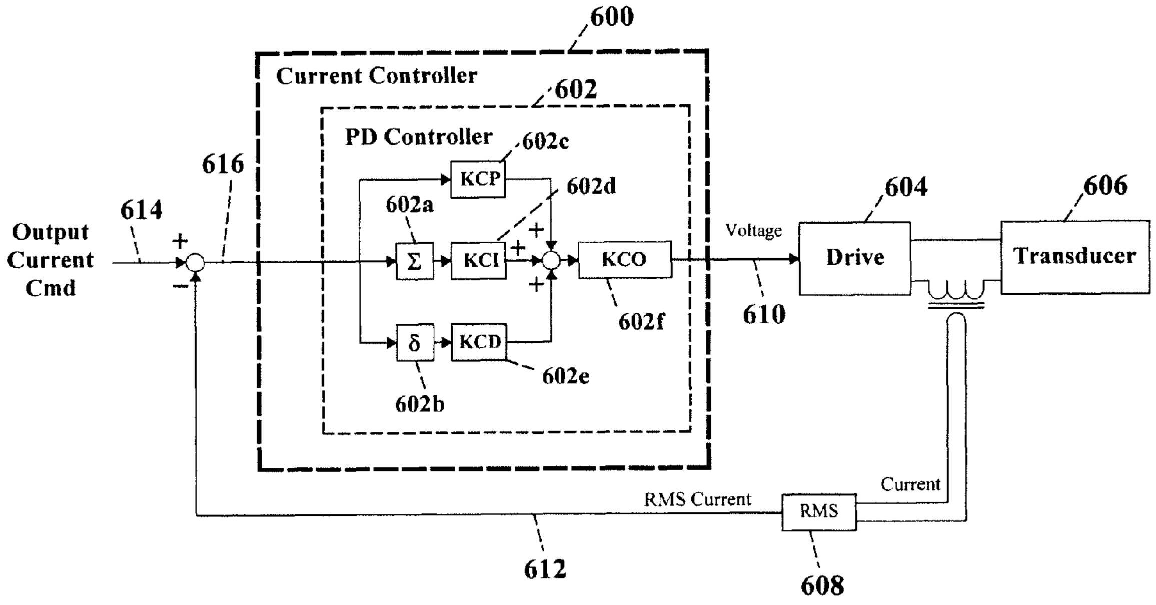
FIG. 7 is a block diagram showing a current controller applying current error to a PID controller in accordance with some embodiments of the present invention.

FIG. 7 shows an embodiment of the current controller 202 in FIG. 3. The current controller 600 maintains current through the transducer at a constant, user-commanded level 614. The user commanded level 614 may correspond to a desired level of operation of a device containing a transducer. For example, the user commanded level may correspond to a desired energy level of a surgical cutting device containing a piezoelectric transducer.

The current controller 600 varies the current through the transducer by varying the drive voltage applied across the transducer. Increasing the drive voltage increases the transducer current and decreasing the drive voltage decreases the transducer current. In some embodiments, the current controller 600 provides a voltage 610 to the drive 604, and this voltage is provided by the drive 604 to the transducer 606.

At a regular sampling intervals, ranging between 5 and 20 msecs, the current controller 600 samples the transducer current and converts it to an RMS current value 612 by an RMS converter 608. At each sampling interval the current controller 600 calculates a current error term 616 by subtracting the sample of the output RMS current 612 from the commanded current 614.

The current controller 600 applies a current error term 616 to a Proportional-Integral-Derivative (PID) controller 602, which generates a response 610 to the error 616. The error 616 is integrated by an integrator 602*a* and differentiated by a differentiator 602*b*. The error 616 and its integral and differential are multiplied respectively by the P, I, and D gains, 602*c*, 602*d*, 602*e* internal to the PID controller, summed, and their sum multiplied by the controller output impedance factor KCO 602*f* to form the controller output voltage 610. Controller gains, 602*c*, 602*d*, 602*e*, 602*f* are set to achieve maximum rise time with an approximately 10% overshoot in the output response to a step in the input. The output impedance factor 602*f* provides both scaling and translation from current to voltage. The controller output voltage 610 is applied to driver 604 to be amplified to become the transducer drive voltage.

In some embodiments, the current controller 600 employs two output impedance factors 602*f*. A larger output impedance factor may be used for the first period of time (nominally 500 msecs) to assure the transducer reaches its steady-state behavior at the given drive power, physical load, and temperature as rapidly as possible. A smaller output impedance factor may be used once the transducer has reached its steady-state behavior. When the switch from the first to the second output impedance factor occurs, the integral of the current error maintained by the PID controller is modified to prohibit an undesired transient in the transducer drive voltage.

In FIG. 3, when the frequency controller 206 sets a drive frequency that results in a change in the frequency control parameter 222, because the transducer current will also change, the current controller 202 will attempt to counter this change. If the frequency controller and the current controller are allowed to operate concurrently, the operation of the frequency controller and the current controller may be in conflict. If the effect of the frequency controller 206 is stronger, frequency tracking will take precedence over a constant output current, and the output current may wander from the commanded value. Conversely, if the effect of the current controller 206 is stronger, a constant output current will take precedence over frequency tracking, and the drive frequency may wander from the transducer resonant frequency.

To achieve balanced operation, the controller scheduler 204 interleaves the operation of the frequency controller 206 and the current controller 202.

When the frequency controller is performing a scan or search operation, the controller scheduler disables the current controller.

When the frequency controller is tracking frequency, in some embodiments the controller scheduler alternates the operation of the two controllers. That is, a controller will execute every 5N msecs, with the current controller executing for odd N and the frequency controller executing for even N.

In some embodiments, both controllers are allowed to operate simultaneously, except immediately after a frequency step. When the frequency controller is tracking frequency, the controller scheduler disables the current controller for the first M 5-msec periods after a frequency step. The number of periods, M, is typically 2, but can be more or less than 2. At the end of the M periods, the frequency control parameter is now only a result of the step in frequency and not of control exerted by the current controller. The frequency control parameter is sampled at this time and stored for the next frequency controller calculation, and the controller scheduler re-enables the current controller.

Output Amplifier and Filtering

Figure 8:
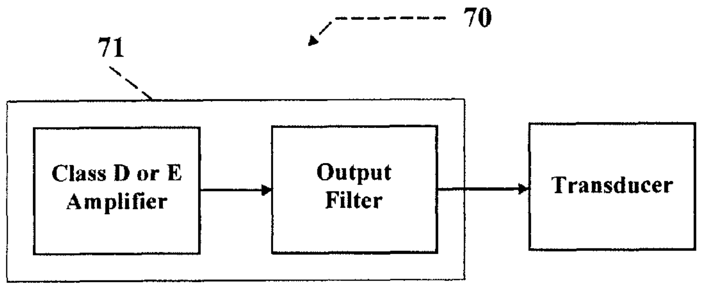
FIG. 8 is a block diagram showing an output filter for filtering a drive signal to a transducer in accordance with some embodiments of the present invention.

The output of the processor running the code discussed previously is a small signal with all the characteristics of necessary to drive and ultrasonic transducer except for the amplitude. The drive circuit 208, 408, 506 can be broken down into two sections as shown in FIG. 8. In FIG. 8 the drive section 71 comprises an amplifier of Class D or E and an output filter.

Prior art has used linear amplifiers for this drive section. These have the disadvantages of being large, inefficient and costly. The illustrated embodiment of FIG. 8 uses a switching amplifier which in some cases can be of Class D or E. Use of switching amplifiers is common in audio applications but new to the field of ultrasonics.

In some embodiments, the drive 208, 408, 506 includes filter circuitry. In some embodiments with a transducer operational range of 20 kHz to 60 kHz, the filter circuitry is configured to have a corner frequency higher than 60 kHz to avoid excessive resonant peaking Depending on the type of transducer and its intended use, it will be appreciated that the transducer operational range can be lower than 20 kHz and/or higher than 60 kHz, and the filter circuitry can be configured to have a corner frequency higher than the transducer operational range. The carrier frequency used can be about 10 times that of the transducer resonance frequency.

In some embodiments the filter circuitry is configured to reduce transmission of the carrier frequency (Fs) from a switching amplifier of the drive 208, 408, 506. Non-limiting examples of filter circuitry are described below.

Figure 9:
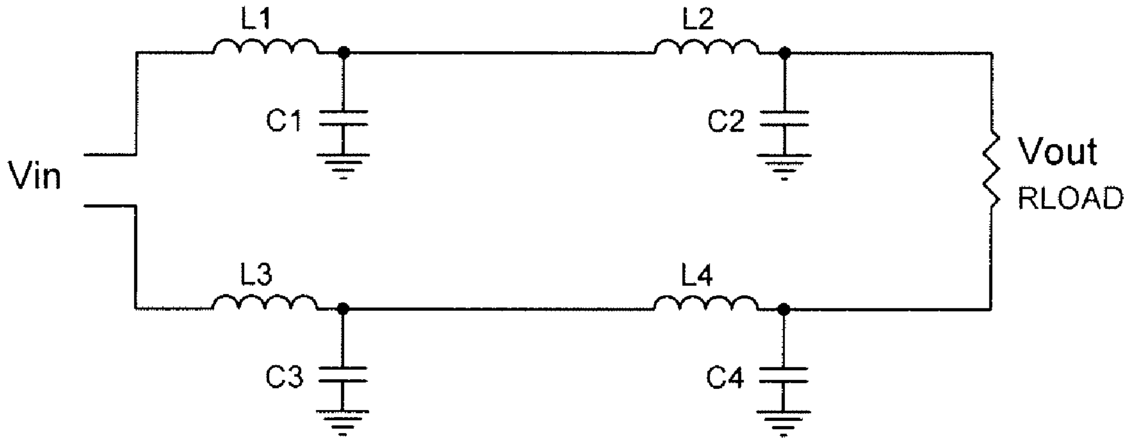
FIG. 9 is a schematic diagram showing an output filter comprising a cascaded LC filter.

In previous art, the output filter of a switching amplifier is typically implemented with an LC or cascaded LC filter. An example of a cascaded LC filter is shown in FIG. 9. FIG. 9 shows the required elements (L1, C1, L2, C2, L3, C3, L4, C4) and the load (RLOAD).

Figure 10:
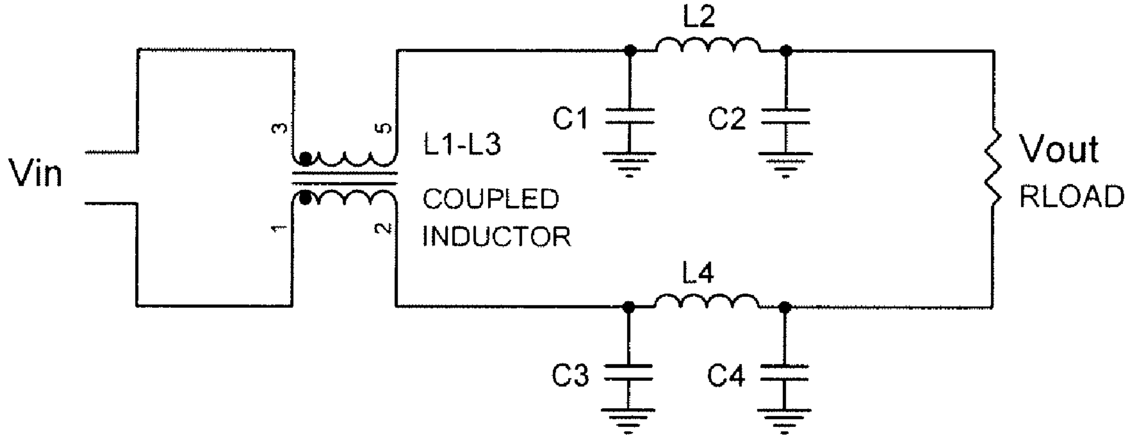
FIG. 10 is a schematic diagram showing an output filter comprising a coupled LCLC filter having magnetically coupled inductors.

Part of this invention is a new form of output filter that includes a coupled inductor as part of the output filter. An example schematic of this new coupled LCLC filter is shown in FIG. 10. FIG. 10 shows the required elements (L1-L3, C1, C3, L2, C2, L4, C4) and the load (RLOAD). The coupled inductor is designed to have a relatively large leakage inductance. Leakage inductance is defined as the residual inductance measured in the winding of a transformer (or coupled inductor) when the unmeasured winding is shorted. When a winding is shorted the magnetizing inductance associated with two windings is eliminated and the remaining inductance is series connection of the leakage inductances in both windings. In case of symmetrical design for both windings, the leakage inductances are close in value, and can be found by measurement by dividing the measured total leakage by two. This leakage inductance acts in place of the separate inductors L1 and L3 shown in FIG. 9, in fact, insuring the same inductance values would insure the same frequency response of the system: with separate or magnetically coupled inductors. In addition to the leakage inductance of the coupled inductor a portion of the signal from one winding is coupled to the other winding.

Figure 11:
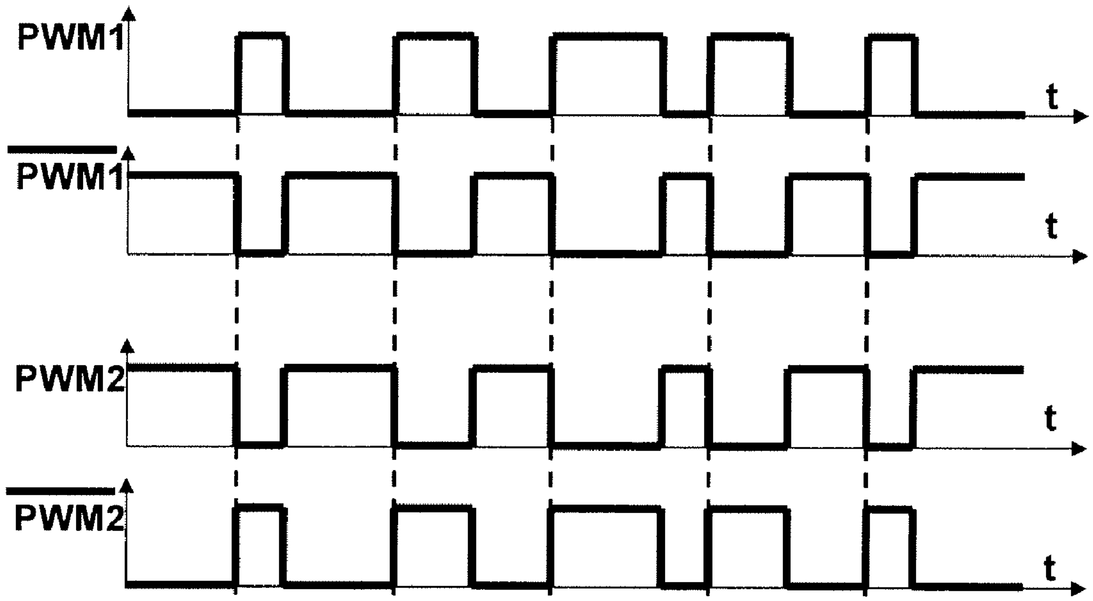
FIG. 11 is a chart showing PWM signals for a dual channel D class amplifier with differential outputs in which the switching periods for all the signals are aligned.
Figure 12:
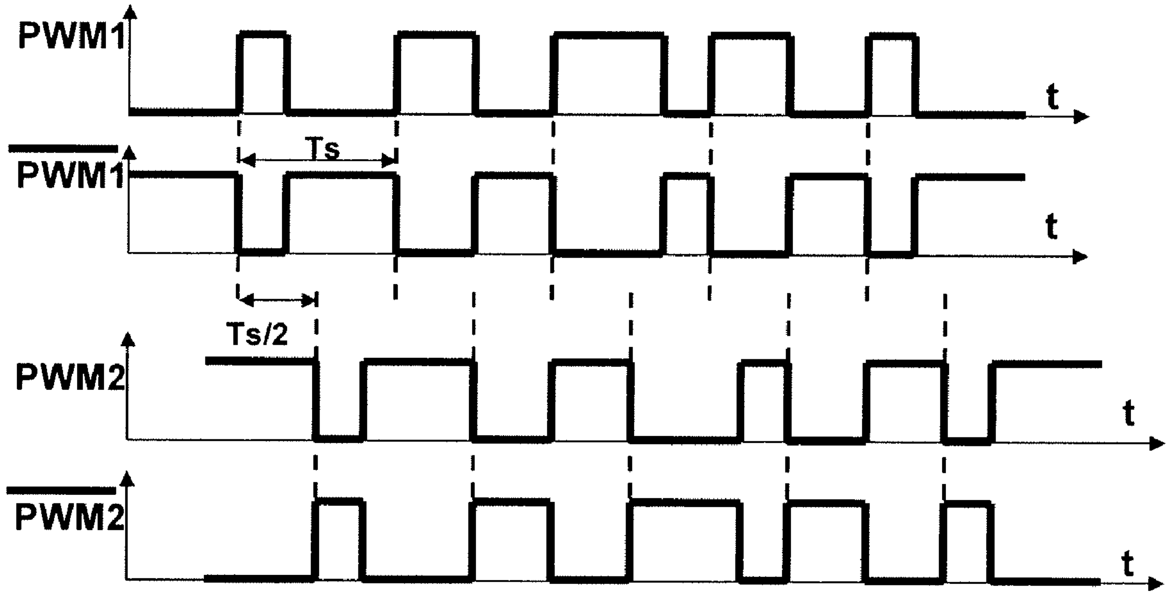
FIG. 12 is a chart showing PWM signals for a dual channel D class amplifier with differential outputs in which a phase shift is inserted between PWM signals for the two channels.

To take advantage of the coupled inductor, a second change is made to the system. The class D or E amplifier from FIG. 8 is often dual channel amplifier, delivering differential output to the load. As typically the same signal is amplified for a singe output, one PWM modulator is used to derive pulses for the both amplifier channels, insuring such connection that output of one channel increases voltage, when another channel decrease the output voltage, and vise versa. This is a common scheme for providing a differential output for such amplifiers. It is also simple to use the same PWM signal and its inverted signal to drive switching devices in both channels of the amplifier, as for example illustrated in FIG. 11 the switching periods for all the signals are aligned. The proposed scheme, on the other hand, inserts a phase shift between PWM signals for the two channels, as shown in FIG. 12. The proposed phase shift between periodic signals is 180 degrees, or half the period. Phase shift between the signals is shown as Ts/2, half of the switching period Ts.

Figure 13:
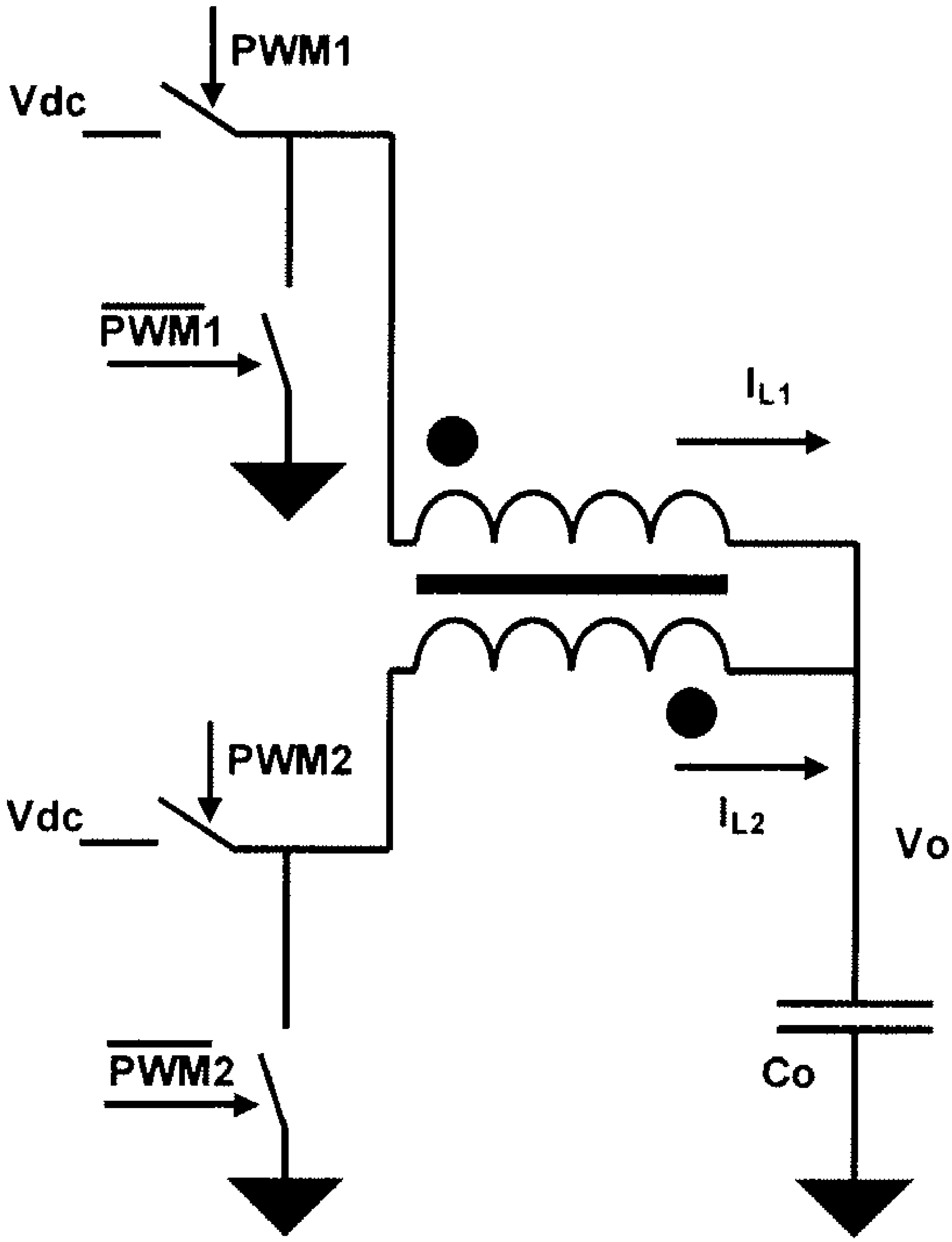
FIG. 13 (PRIOR ART)
FIG. 13 is a schematic diagram showing a mutliphase buck converter with coupled inductors.

The described phase shift between two or more channels can be found in prior art, for example in multiphase buck converter applications, or in U.S. Pat. No. 6,362,986 to Shultz et al., entitled "Voltage converter with coupled inductive windings, and associated methods." U.S. Pat. No. 6,362,986 represents closer prior art, as it has phase shift together with magnetic coupling between inductors, as illustrated in FIG. 13, where only two phases of multiphase buck converter are shown. This inventions proposed arrangement is shown in FIG. 14, so the differences from prior art in FIG. 13 are illustrated clearly.

Figure 14:
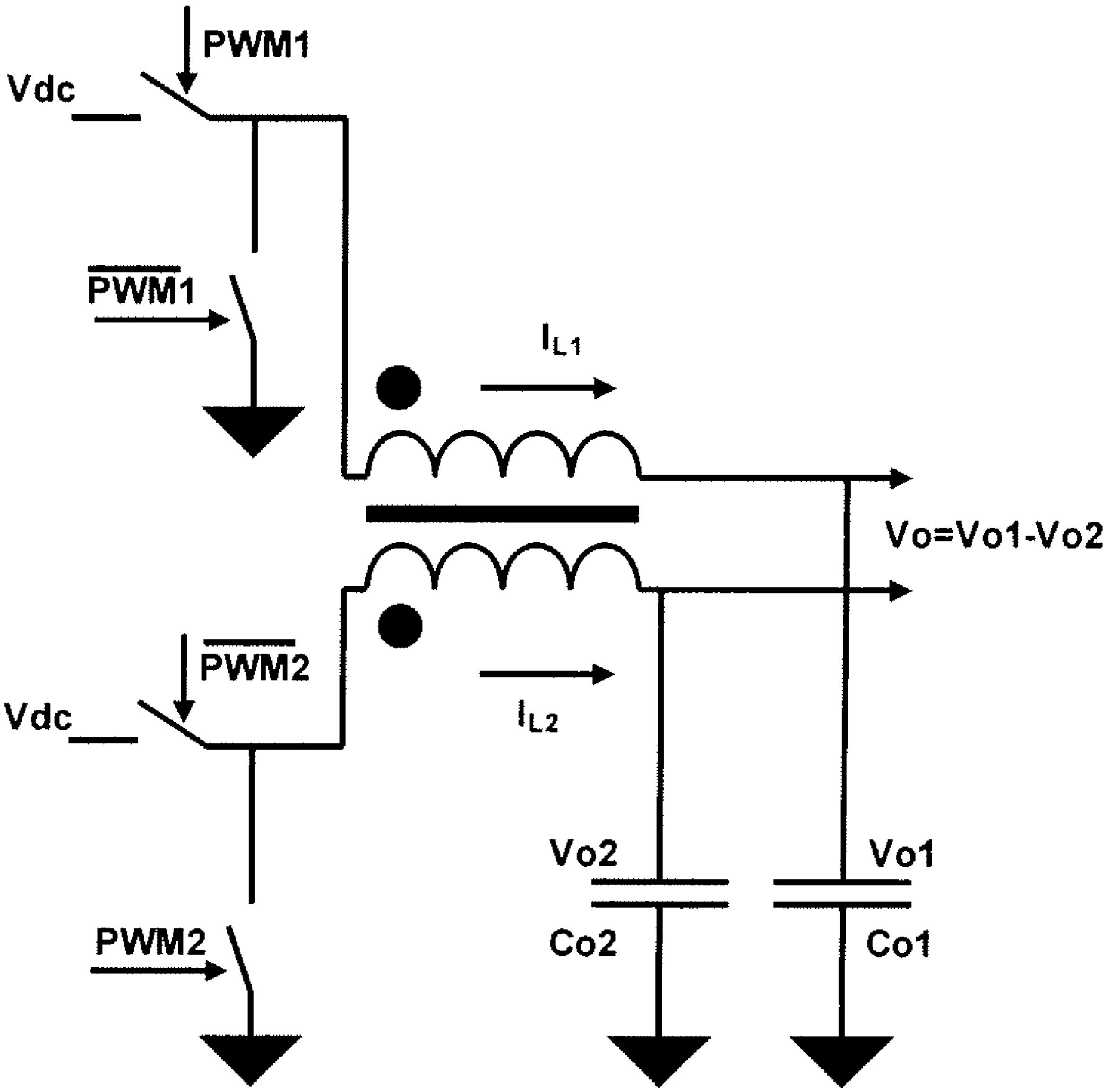
FIG. 14 is a schematic diagram showing a differential amplifier output stage with coupled indcutors.

Notice that the output voltage of circuit in FIG. 14 is differential, while in FIG. 13 it is not. With zero input signal for the amplifier, the duty cycle of both PWM1 and PWM2 in FIG. 14 is 0.5, so Vo1=Vo2=Vdc/2. This relates to zero differential output voltage. When input signal is applied to modulators, if Vo1 rises to positive rail Vdc from Vdc/2—then Vo2 is dropping towards zero from the same Vdc/2. The currents in inductors in FIG. 14 are also opposite, as compared to added currents in FIG. 13. If current IL1 is positive (sourcing), then the current IL2 is negative (sinking). Notice also that the average values of the IL1 and IL2 are absolutely equal, as these outputs are effectively shorted to each other through the load in series. The magnetic coupling of proposed arrangement in FIG. 14 is also in phase, relatively to the pins connected to the outputs of the amplifier channels or phases. The prior art arrangement in FIG. 13 uses inverse magnetic coupling, relatively to the outputs of the buck converter stages. The load in FIG. 13 is typically connected from the common connection of all inductors to the ground or return, while the load for circuit in FIG. 14 should be connected between two differential outputs.

Magnetic coupling between windings in FIG. 14 effectively doubles the frequency of the current ripple in each winding because when one winding or channel switches it induces a current ripple in the opposite winding even though that winding did not switch yet (due to the phase shift).

Figure 15:
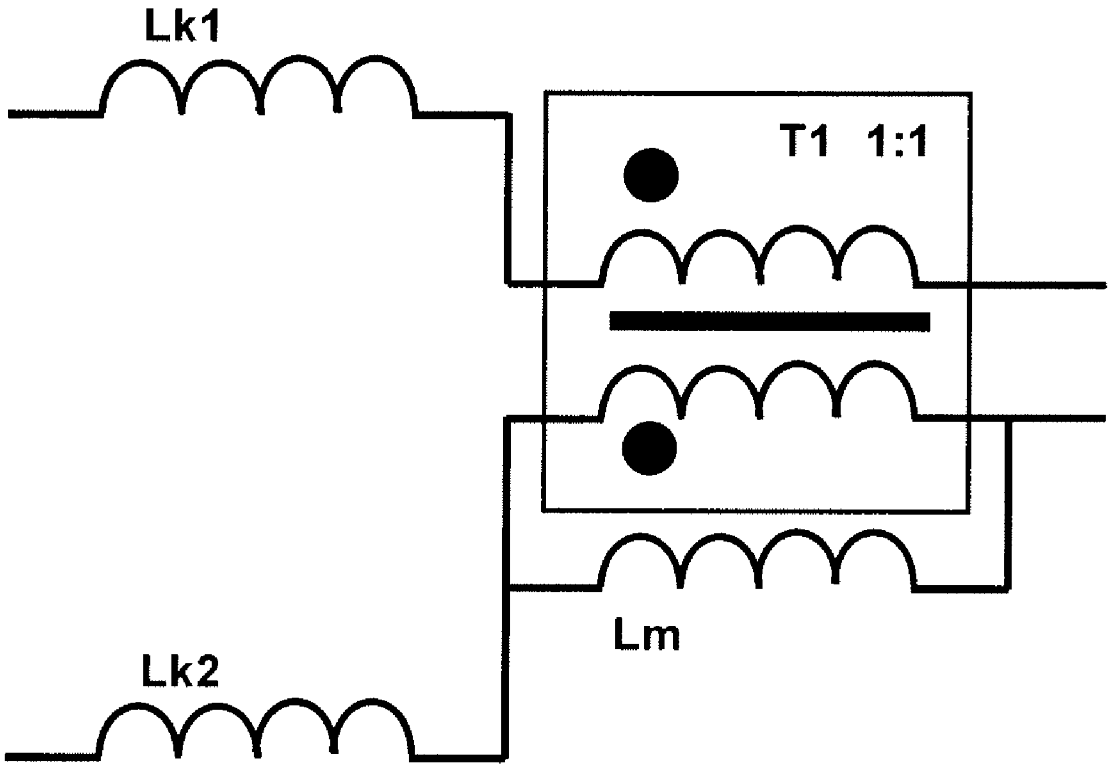
FIG. 15 is schematic diagram showing a simplified general model of the coupled inductor of FIG. 14.

The coupled inductor from FIG. 14 can be modeled as ideal transformer T1 in FIG. 15, with ideal magnetic coupling, with added magnetizing inductance Lm and leakages in each winding Lk1 and Lk2. These leakage inductances could be also made external, for example, standard transformer with good magnetic coupling and negligible leakage could be used with external separate inductance added in series with each winding. The general coupled inductor model for arrangement in FIG. 14 is shown in FIG. 15, where Lk1 and Lk2 can be leakage inductances of the common structure, or dedicated external inductors.

Figure 16:
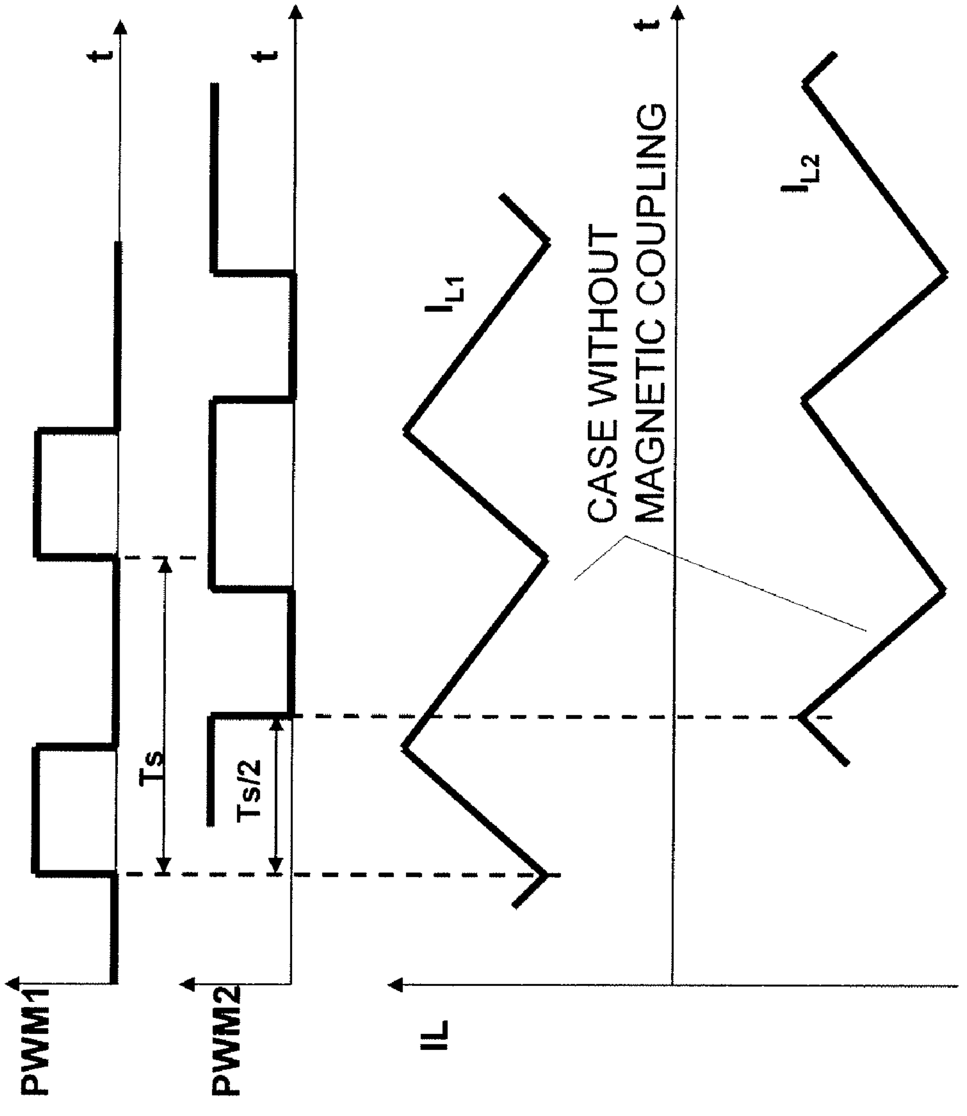
FIG. 16 is a chart showing waveforms for FIG. 14 when inductors are not magnetically coupled.
Figure 17:
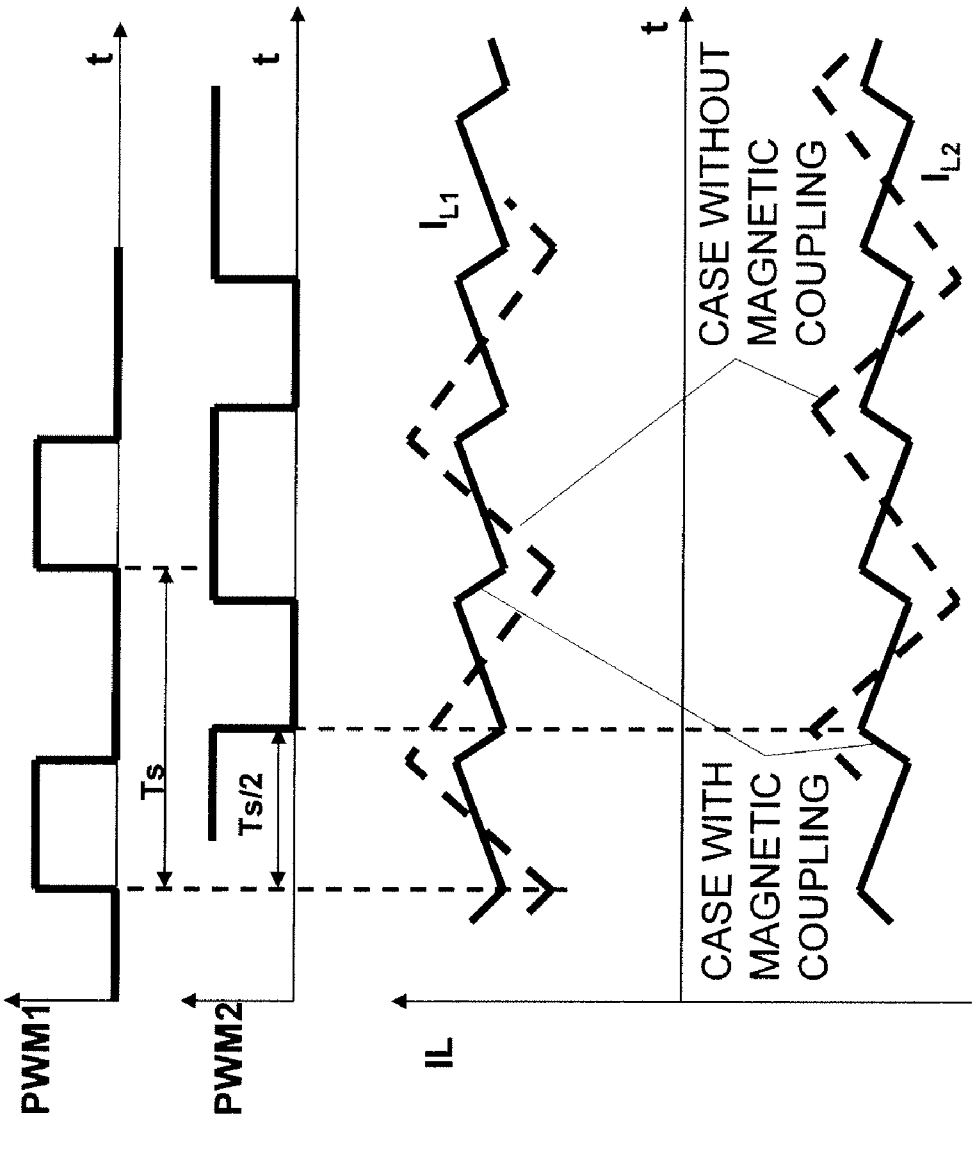
FIG. 17 is a chart showing waveforms for FIG. 14 when inductors are magnetically coupled, the solid lines for inductor current corresponding to inductors magnetically coupled and broken lines for inductor current corresponding to inductors without magnetic coupling.
Figure 18:
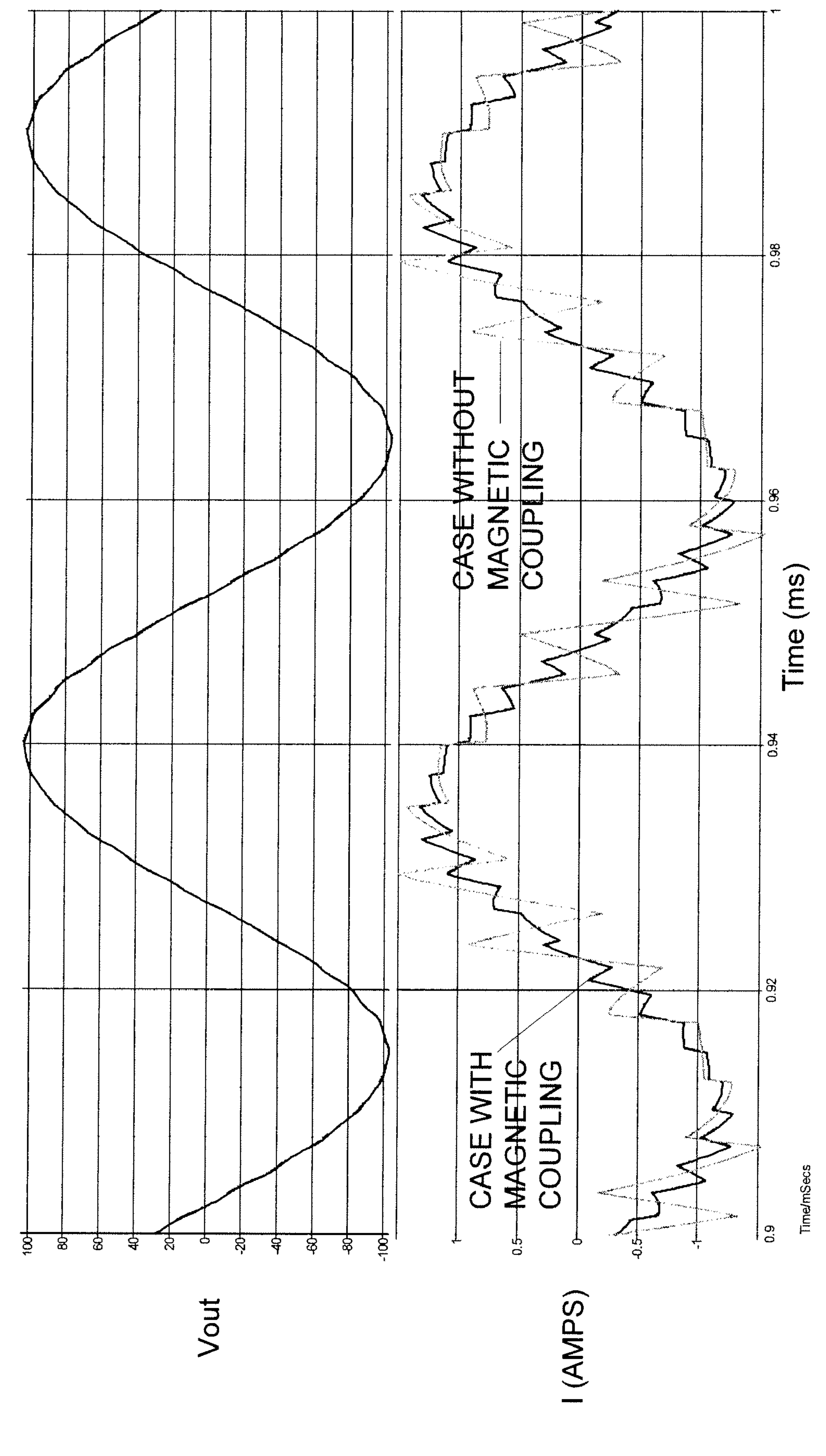
FIG. 18 is a chart showing waveforms for a 20 kHz output signal with 90 uH/94 nF filters with added 180 phase shift in a second oscillator, Vdc=100V, Rload=100, the solid lines for inductor current corresponding to inductors magnetically coupled and broken lines for inductor current corresponding to inductors without magnetic coupling.

Waveforms for the circuit in FIG. 14 with no magnetic coupling between inductors is shown in FIG. 16. Inductors work as energy storage components, ramping current up and down under applied voltage across the related inductor. Applied voltage changes only due to the switching of the related power circuit, where the inductor is connected. FIG. 17 shows the same waveforms but when inductors in FIG. 14 are magnetically coupled. Due to magnetic coupling, applied voltage across the leakage inductances is changed not only due to the switching of the related power circuit, where the inductor is connected, but also when another power circuit switches. This effectively doubles the frequency of the current ripple in each coupled inductor, for the illustrated case where two inductors are magnetically coupled, and the phase shift between two driving signals is 180 degrees. This coupling effect leads to the decrease of the current ripple amplitude in the each inductor. FIG. 18 illustrates the decrease of the current ripple in inductor for particular example. Sine wave signal of the 20 KHz frequency is delivered at the differential output of the amplifier, where two channels have a phase shift for the switching signals of 200 KHz main PWM frequency. The bottom traces show inductor current without and with magnetic coupling, clearly indicating the current ripple decrease.

The decreased current ripple offers several benefits to the circuit and its performance. Decreased current ripple makes it easier for the output filter to achieve low noise levels and low output voltage ripple at the output, in other words—either smaller attenuation could be used as compared to the case without magnetic coupling, or lower noise level can be achieved. Decreased amplitude of the current ripple also means that the RMS value of the current waveform is lower, which relates to lower conduction losses. Lower current ripple also implies lower peaks of the current, which relates to the lower stress in switching devices of the power circuits. As the DC component of the load current is the same in both coupled inductors (the outputs are connected to each other through the load so the load current is equal), and since these currents create opposite magnetic flux for arrangement shown in FIG. 14—cancellation of the DC component of the magnetic flux in the core is beneficial for the small core size and low core losses. The decrease of the current ripple is generally good for EMI decrease, and makes it easier to pass regulatory requirements. While the performance of the filter in terms of the amplifier signals is dependent on the leakage inductance values, the noise signals of the Common Mode (same in both output nets) will be attenuated by much larger magnetizing inductance. In this regard, Common Mode noise, often being present in circuits and representing a need for additional high frequency filtering for the output connections, will be attenuated at much higher degree in magnetically coupled inductor arrangement in FIG. 14, as compared to the same arrangement but without magnetic coupling.

Figure 19:
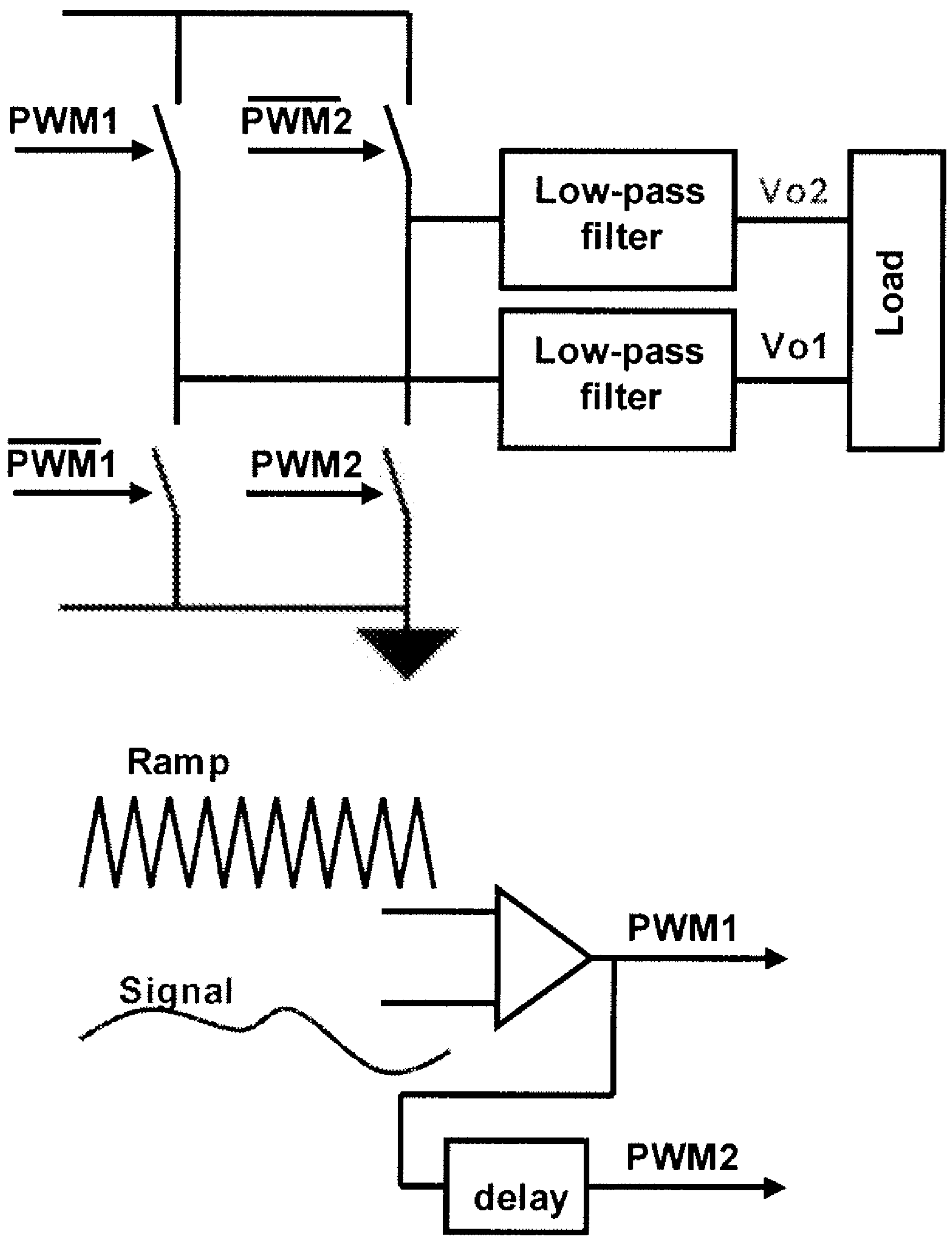
FIG. 19 is a diagram showing a D class amplifier with differential outputs in which a first PWM output signal is delayed to generate a second PWM output signal.

The phase shifted PWM2 signal for the second differential amplifier circuit in FIG. 12 can be created with a second PWM modulator, where the ramp for the second modulator is phase shifted from the ramp for the first one. However, the cheaper and simpler alternative is also proposed, which also improves the noise immunity and insures reliable current ripple cancellation, is to use one PWM modulator, and just delay that signal by half the switching period to achieve 180 degrees phase shift for the second channel signals, as shown in FIG. 19. As the modulator frequency is typically much higher than the maximum frequency of the amplified signal, the introduced signal distortion can be minimized.

The magnetic components from FIG. 14 could be arranged in a single structure with two windings. Such structure could be called a transformer with purposely large leakage or decreased coupling.

Figure 20:
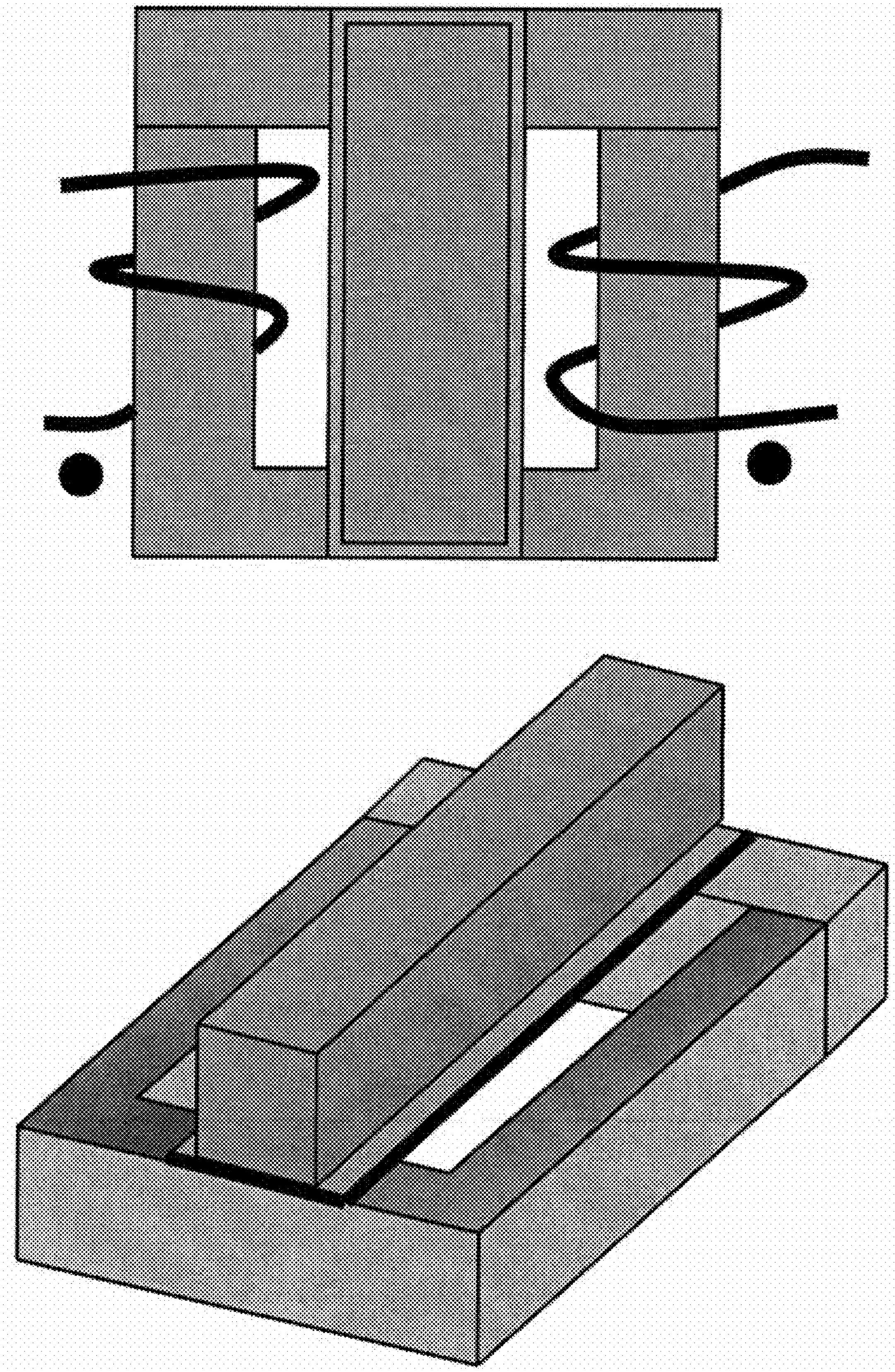
FIGS. 20-22 shows simplified diagrams showing varying arranges for a transformer with leakage, the transformer corresponding to magnetically coupled inductors in an output filter.
Figure 21:
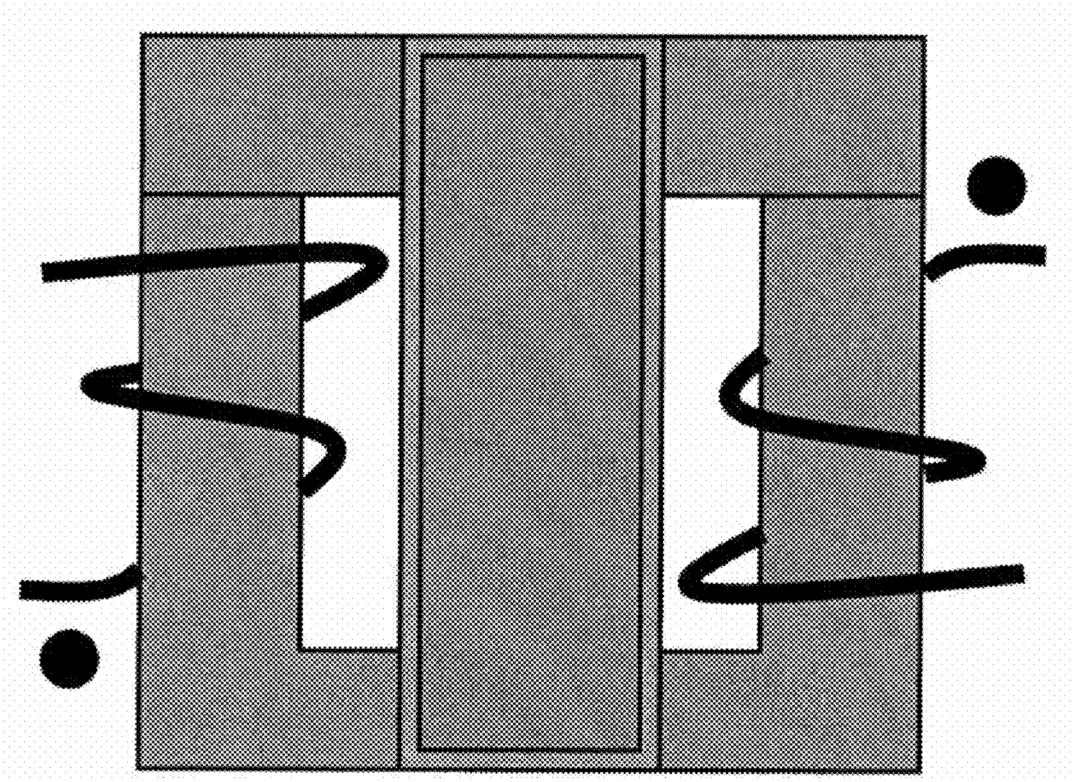
Figure 22:
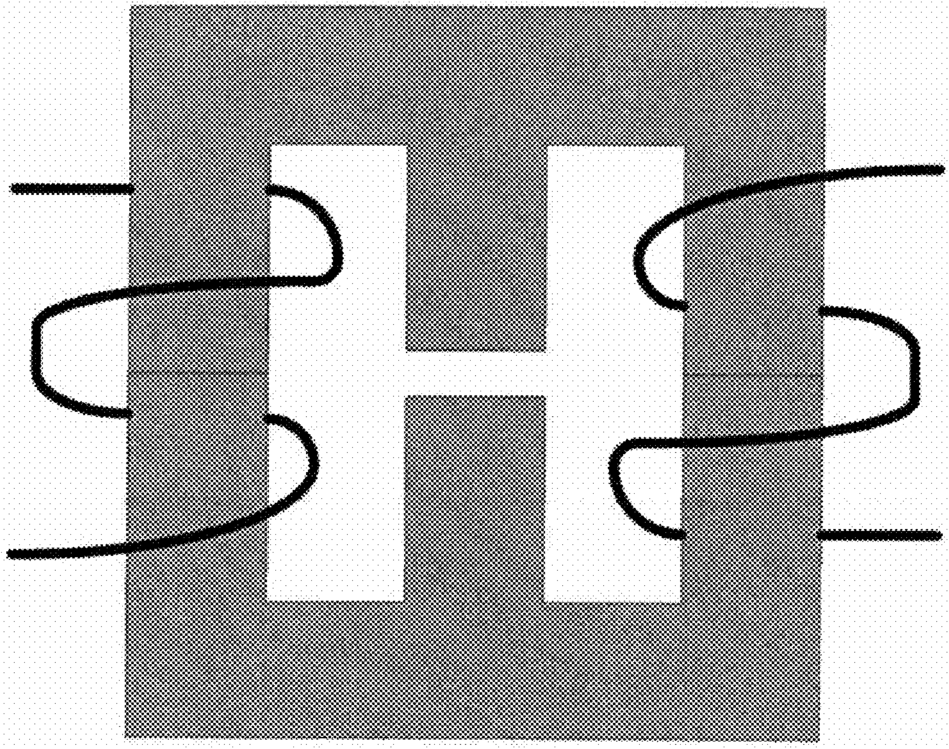

FIG. 20 shows one possible implementation for transformer with leakage. This structure will create have leakage via air paths, but the value would be difficult to control accurately in a manufacturing environment. FIG. 21 and FIG. 22 show additional arrangements for transformer with leakage. FIG. 22 allows the best control of the leakage (gap value—spacer thickness).

The above described transducer can be a part of or contained in any type of apparatus, including without limitation a surgical device, a cutting tool, a fragmentation tool, an ablation tool, and an ultrasound imaging device.

While several particular forms of the invention have been illustrated and described, it will also be apparent that various modifications can be made without departing from the scope of the invention. It is also contemplated that various combinations or subcombinations of the specific features and aspects of the disclosed embodiments can be combined with or substituted for one another in order to form varying modes of the invention. Accordingly, it is not intended that the invention be limited, except as by the appended claims.

What is claimed is:

1. A system for driving an ultrasonic transducer, the system comprising:

a controller adapted to provide a voltage and a frequency, the controller configured to vary the voltage based on a current error signal derived from a drive current through a transducer and from a current command, the controller configured to vary the frequency based on at least one parameter indicative of whether the transducer is at or near a resonance state; and a drive adapted to receive the voltage and the frequency from the controller, and adapted to provide a drive voltage at a drive frequency to the transducer based on the voltage and the frequency received from the controller, the drive voltage being at a level that maintains the drive current at substantially the current command, the drive frequency being at substantially a resonant frequency of the transducer, wherein the at least one parameter includes a phase angle between the drive current and the drive voltage.

2. The system of claim 1, wherein the at least one parameter further includes admittance of the transducer.

3. The system of claim 1, wherein the controller includes a current controller configured to vary the voltage based on the current error signal, a frequency controller configured to vary the frequency based on the at least one parameter, and a controller scheduler configured to alternate operation of the current controller and the frequency controller.

4. The system of claim 3, further comprising a sense circuit configured to provide a measure of the drive current and to generate and provide to the frequency controller a measure of admittance of the transducer and the at least one parameter.

5. The system of claim 3, wherein the frequency controller is configured to execute a frequency scan that finds a frequency that is at or near the resonant frequency of the transducer and to set the drive frequency to the frequency that is found.

6. The system of claim 3, wherein the frequency controller includes a frequency tracker configured to execute a frequency track function that adjusts the drive frequency to compensate for a fluctuation in the resonant frequency.

7. The system of claim 6, further comprising a frequency generator, wherein the frequency tracker includes a peak detector and a frequency stepper commanded by the peak detector to determine a first frequency step, the first frequency step having random step size between a predetermined frequency range and having a random step direction being either up or down, the frequency stepper configured to provide the frequency step to the frequency generator which generates a new frequency based on the frequency step, the frequency generator configured to provide the new frequency to the drive;

wherein when admittance of the transducer increases by an amount greater than a predetermined amount as a result of the new frequency, the frequency stepper determines a next frequency step having the same step direction as the first frequency step and having a step size based on the amount of admittance increase; and wherein when admittance of the transducer decreases by an amount greater than the predetermined amount as a result of the new frequency, the frequency stepper determines a next frequency step having the opposite step direction as the first frequency step and having a step size based on the amount of admittance decrease.

8. The system of claim 6, further comprising a frequency generator;

wherein the frequency tracker includes a feedback controller configured to receive a phase angle error term as input and to output a frequency step having a magnitude and a direction that drive the phase angle error term toward zero, the phase angle error being a difference between a command phase term and the phase angle; and wherein the frequency generator is configured to generate a new frequency based on the frequency step and to provide the new frequency to the drive.

9. The system of claim 1, wherein the controller includes a feedback controller configured to receive the current error signal as input and to output a voltage that drives the current error signal to zero, the current error signal being a difference between the current command and the drive current; and wherein the drive is configured to generate the drive voltage by amplifying the output voltage.

10. The system of claim 1, wherein the drive includes a switching amplifier.

11. The system of claim 10, wherein the switching amplifier includes an output filter, the output filter including a pair of in-phase magnetically coupled inductors.

12. The system of claim 11, wherein the switching amplifier is a dual channel amplifier configured to deliver two differential outputs in which output of a first channel and output of a second channel are phase shifted from each other by 180 degrees.

13. The system of claim 12, wherein the in-phase magnetically coupled inductors are configured to double the frequency and decrease the amplitude of current ripple in each of the in-phase magnetically coupled inductors.

14. The system of claim 1, wherein the controller and drive are coupled to an apparatus containing the transducer, the apparatus selected from the group consisting of a surgical device, a cutting tool, a fragmentation tool, an ablation tool, and an ultrasound imaging device.

15. A method for driving an ultrasonic transducer, the method comprising:

providing a drive voltage at a drive frequency to a transducer, the drive voltage causing a drive current through the transducer;

sensing the drive current;

determining a current error from the sensed drive current and from a current command;

adjusting the drive voltage based on the current error;

determining at least one parameter from the sensed drive current and from the voltage level, the at least one parameter indicative of whether the transducer is at or near a resonance state, the at least one parameter including a phase angle between the drive current and the drive voltage;

adjusting the drive frequency based on the at least one parameter, including maintaining the drive frequency at or substantially at a resonant frequency of the transducer.

16. The method of claim 15, wherein the adjusting of the drive frequency includes applying a phase error term to a proportional-derivative controller, the phase error term being a difference between a command phase term and the phase angle between the drive current and the drive voltage.

17. The method of claim 15, wherein the providing of the drive voltage at the drive frequency to the transducer includes filtering differential outputs of a dual channel switching amplifier, the filtering performed at least in part by using a pair of in-phase magnetically coupled inductors.

18. The method of claim 17, wherein the filtering includes phase shifting by 180 degrees output of a first channel of the switching amplifier from output of a second channel of the switching amplifier.

19. The method of claim 18, wherein the filtering further includes simultaneously doubling the frequency and decreasing the amplitude of current ripple in each of the in-phase magnetically coupled inductors.

20. The method of claim 15, wherein the transducer is contained in an apparatus selected from the group consisting of a surgical device, a cutting tool, a fragmentation tool, an ablation tool, and an ultrasound imaging device.

* * * * *